(12) United States Patent
Yamanaka (10) Patent No.: US 7,593,226 B2
(45) Date of Patent: Sep. 22, 2009

(54) COOLING FAN MOUNTING STRUCTURE FOR FLAT DISPLAY, AND PLASMA TELEVISION SET

(75) Inventor: Takahito Yamanaka, Osaka (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 35 days.

(21) Appl. No.: 12/074,355

(22) Filed: Mar. 1, 2008

(65) Prior Publication Data

US 2008/0218446 A1 Sep. 11, 2008

(51) Int. Cl.
*H05K 7/20* (2006.01)

(52) U.S. Cl. ............... 361/695; 361/690; 361/694; 345/905

(58) Field of Classification Search ............... None
See application file for complete search history.

(56) References Cited

U.S. PATENT DOCUMENTS

| 7,155,923 B2 * | 1/2007 | Nam et al. | 62/259.2 |
| 7,190,578 B2 * | 3/2007 | Bang et al. | 361/694 |
| 7,369,407 B2 * | 5/2008 | Kim | 361/695 |
| 7,436,668 B2 * | 10/2008 | Bae | 361/704 |
| 7,466,546 B2 * | 12/2008 | Park | 361/695 |

FOREIGN PATENT DOCUMENTS

| JP | H07-154720 A | 6/1995 |
| JP | 08-228086 | 9/1996 |
| JP | 2003-029648 A | 1/2003 |
| JP | 2003-173147 | 6/2003 |
| JP | 2003-173147 A | 6/2003 |
| JP | 2005-197421 | 7/2005 |
| JP | 2005-235843 A | 9/2005 |

OTHER PUBLICATIONS

Japanese Notice of the reason for refusal, dated Nov. 12, 2008.

* cited by examiner

*Primary Examiner*—Boris L Chervinsky
(74) *Attorney, Agent, or Firm*—Yokoi & Co., U.S.A., Inc.; Peter Ganjian (57) ABSTRACT

A cooling fan mounting structure for a flat display displaying an image on a screen based on a video signal is disclosed. The structure includes a chassis bracket attached to a rear of the display, and a type of fan holder to which the cooling is attached. The fan holder has an end with an insertion hole located in alignment with a screw hole and through which a screw is inserted to be fixed when the chassis bracket is attached, a positioning convex portion fitted into a positioning hole positioning the chassis bracket, and a locking claw bent into such a crank shape that the locking claw has a step located lower by a thickness of the chassis bracket and extends from the step, the positioning convex portion being inserted into the rectangle hole to be locked.

6 Claims, 7 Drawing Sheets

COOLING FAN MOUNTING STRUCTURE FOR FLAT DISPLAY, AND PLASMA TELEVISION SET

CROSS-REFERENCES TO RELATED APPLICATIONS

The present application is related to the Japanese Patent Application No. 2007-056387, filed Mar. 6, 2007, the entire disclosure of which is expressly incorporated by reference herein.

BACKGROUND OF THE INVENTION (1) Field of the Invention

The present invention relates to a cooling unit mounting structure for a flat display, and a plasma television set employing the cooling unit mounting structure for the flat display.

(2) Description of Related Art

Television sets displaying broadcast image on a display have long been popular in families as a key media on which we watch amusement programs, movies, news or the like. The size of a screen of the television set has been increased with improvement in living standards. However, CRT-based television sets which have long been predominant have problems in a depth, weight or dissipation power because of the structure thereof. An increase in the size of a cathode ray tube sees the end coming.

On the other hand, display devices such as plasma television sets and liquid crystal displays which quite differ from the cathode ray tube have recently been developed as the result of improvements in the electronic, semiconductor or material technique. These display devices are thinner as compared with the conventional cathode ray tube. Accordingly, television sets provided with these display devices are generally referred to as flat-screen television sets.

The flat-screen television sets have realized lower costs and larger size together with progress in the technical development and volume efficiency. The flat-screen television sets have now replaced the conventional cathode ray tube system and enlarged its market because of demand due to replacement with transition from terrestrial broadcasting to digital and in consistent with housing conditions in Japan.

When a television employing the above-described flat display is manufactured, general-purpose panel components supplied by a panel manufacturer are sometimes assembled together into a panel assembly, to which a unique control processing technique and the like are added. In such assembling of general-purpose panel components, the panel components, a filter and a resin-molded cabinet are generally assembled together.

Figure 6:
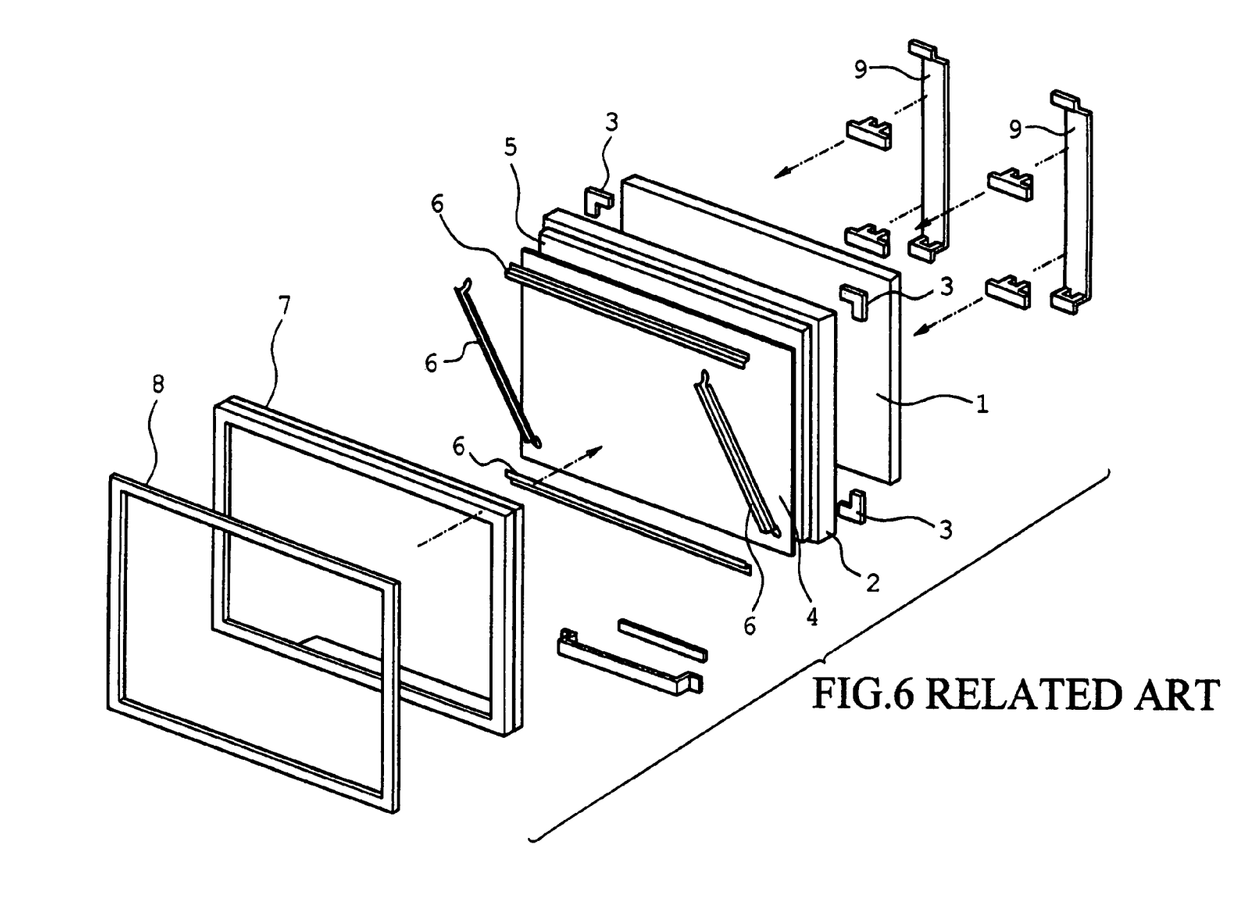
FIG. 6 is a perspective view explaining a conventional art.

FIG. 6 shows a conventional assembling structure in the case where a flat display is a plasma display panel. A plasma display panel 1 is attached to a rear of a standing generally frame-like panel holder 2 with spacers 3 being mounted on four corners of the panel holder rear. The plasma display panel 1 is fixed to the panel holder 2 by screws at one side of the latter. The spacers 3 are provided in order that the plasma display panel 1 is spaced from a filter 4 as will be described later.

On the other hand, the filter 4 is attached to a front of the panel holder 2 with a gasket 5 being interposed therebetween. Upper, lower, right and left sides of the filter 4 are engaged with four film holders 6 each of which is a linear frame having a step with a crank-shaped section. The filter 4 is then fixed by screws at the front of the panel holder 2. A generally frame-like cabinet 7 is attached to the panel holder 2 with the filter 4 at the front side of the panel holder 2. A bezel 8 is then attached to the cabinet 7 so as to cover a gap between the cabinet 7 and a view-area outer periphery. The cabinet 7 and the bezel 8 are fixed by screws at rear of the panel holder 2.

Two parallel chassis brackets 9 are mounted on the upper and lower frame portions of the panel holder 2 so as to be located at the rear side of the plasma display panel 1. A control board, an input/output device and the like are mounted on the chassis brackets 9. Thus the chassis brackets 9 structurally serve as backbones.

In the assembling of the plasma display panel 1, the panel holder 2, plasma display panel 1, filter 4, cabinet 7, chassis brackets 9 and the like are assembled together while these components are standing.

Since high voltage is applied to the plasma display panel 1, a large amount of heat is generated from the plasma display panel 1, the control board mounted on the rear of the plasma display panel 1 and the like during operation of the plasma display panel 1. Moreover, a rear cabinet (not shown) is mounted around the plasma display panel 1 so as to be close to the same, whereupon a closed space is defined in which heat tends to remain.

A fan is provided for cooling an interior atmosphere by sucking and discharging heated air in the interior space in order that an increase in the interior temperature due to the above-described heat generation may be restrained for stable operation. For example, two cooling fans 9a are mounted using a dedicated fan holder 9b so as to be located between the plasma display panel 1 and the rear cabinet and so as to slightly be displaced upward so that the cooling fans are prevented from overlap with the control board.

Figure 7:
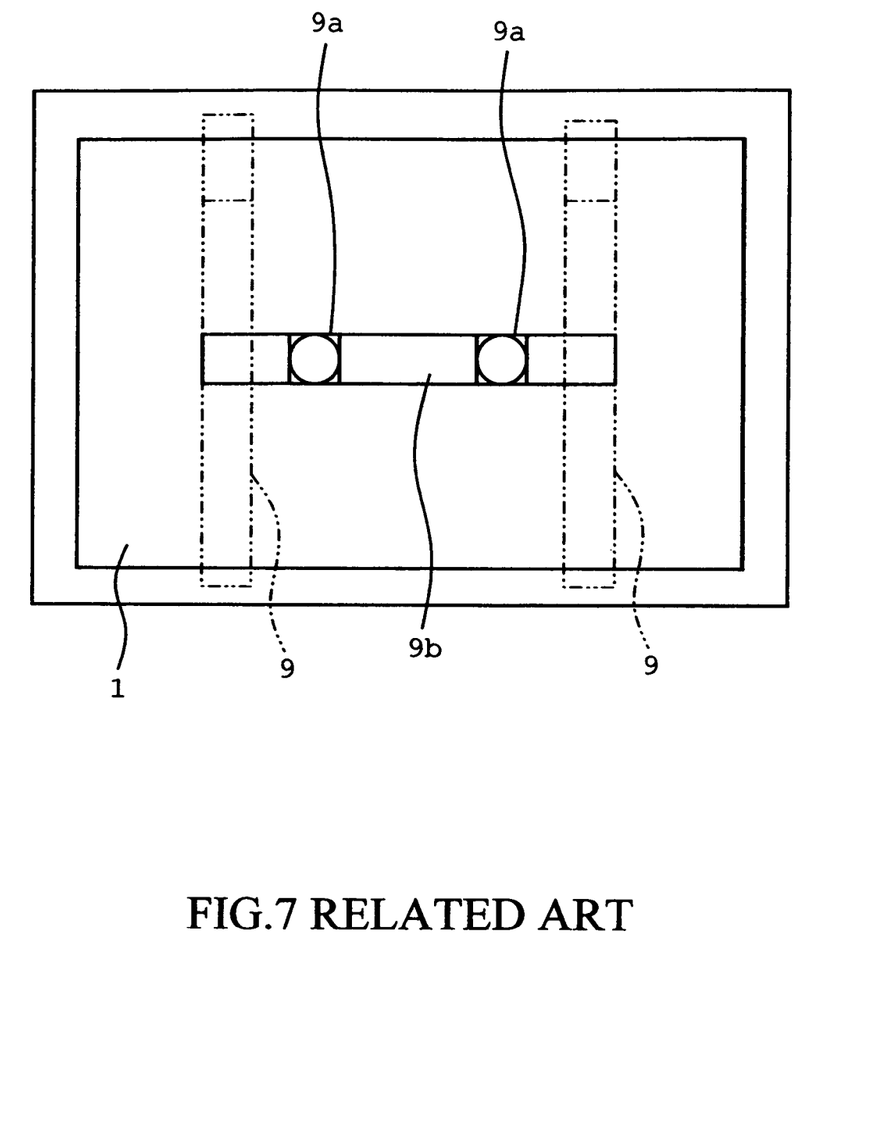
FIG. 7 is a front view explaining the conventional art.

The fan holder 9b is generally plate-shaped as shown in FIG. 7. The fan holder 9b extends between the two parallel chassis brackets 9 and horizontally screwed so that the cooling fans 9a are spaced at the rear side of the plasma display panel 1.

The fan holder 9b has two through holes at predetermined locations respectively. The cooling fans 9a are screwed in the through holes respectively. The rear cabinet has slits provided for air discharge and opposed to the cooling fans 9a respectively.

Air remaining in a closed space defined between the plasma display panel 1 and the rear cabinet is discharged outside through the slits of the rear cabinet. Consequently, the closed space is maintained at or above a predetermined temperature so that a stable operation of the plasma display can be ensured.

However, the above-described cooling fan mounting structure has the following problems. More specifically, as described above, when television sets employing a flat display such as the plasma display panel 1 are manufactured, general purpose components supplied from a panel manufacturer are assembled together, and a unique control processing technique and the like are added to the panel assembly in many cases. In this case, when a plurality of panel manufacturers are involved, specifications of the display panels such as configurations, dimensions of the display panels differ between or among the panel manufacturers. Accordingly, a plurality of fan holders 9b having different configurations need to be prepared according to the different specifications of the fan holders 9b. This results in cost increases.

In the above-described assembly of the plasma display panel 1, the components such as the panel holder 2, plasma display panel 1, filter 4, cabinet 7 and chassis brackets 9 are assembled together while these components are standing. Accordingly, while holding the fan holder 9b by one hand, a work needs to fasten the screws so that the fan holder can be prevented from falling and screw holes are correctly aligned. Thus, the working efficiency is low.

Furthermore, hot air tends to rise upward and accordingly, hot air in a lower area of the closed space relative to the mounting locations of the cooling fans 9*a* is discharged more efficiently. However, hot air in an upper area of the closed space relative to the mounting locations of the cooling fans 9*a* tends to remain in the area. A cooling fan with a higher discharge performance needs to be provided so that a sufficient air discharge is carried out, resulting in increases in costs, noise and electric power consumption.

Furthermore, the components such as the control board, input/output device and the like are mounted on each chassis bracket 9 as described above. These components become obstacles when the cooling fans 9*a* are mounted at locations suitable for air discharge. As a result, a sufficient cooling performance cannot be achieved or a depth of the plasma display panel is increased.

On the other hand, the conventional art provides the following mounting structures for a cooling fan mounted in electronic equipment.

More specifically, in JP-A-H08-228086, a mounting structure is described in which a holder has an open end from which engagement pieces and a positioning part extend and slits and screw holes are provided. A cooling fan is housed in the holder, and an engagement portion, a positioning protrusion, an engagement claw and screw hole are provided in a peripheral edge of a discharge hole of the equipment housing so as to correspond to the slits and screw holes. The cooling fan is mounted on the housing with a holder being interposed therebetween. According to the above structure, the mounting work can easily be carried out.

In JP-A-2005-197421, a fan is housed in a fan box formed with a hook engagement portion. A hook corresponding to the hook engagement portion is provided on a rear panel of the equipment. A fan is mounted on the rear panel with the fan box being interposed therebetween. According to the above structure, the mounting work can easily be carried out, too.

In JP-A-2003-173147, a board mounted on the rear of a display panel with gaps from upper and lower reinforcing ribs. A discharge space is ensured for cooling air flowing from the gaps. According to the above structure, cooling can reliably be carried out.

In JP-A-H08-228086, when a cooling fan is mounted, the mounting work can be simplified as compared with a simple mounting structure using screws. JP-A-2005-197421 fan holders having different configurations need to be prepared accordingly. The problem of cost increases cannot be overcome.

Furthermore, the problem of discharge of hot air in the upper space relative to the mounting position of the cooling fan cannot be overcome, either.

In the structure described in JP-A-2005-197421, the cooling fan is mounted with interposition of the fan box as in the description of JP-A-H08-228086. As a result, the mounting work can be rendered easier as compared with the mounting structure employing the screws. In this structure, however, when a plurality of panel manufacturers are involved, fan boxes with different configurations need to be prepared. The problem of cost increases cannot be overcome.

Furthermore, the problem of discharge of hot air in the upper space relative to the mounting position of the cooling fan cannot be overcome, either.

In the structure described in JP-A-2003-173147, the problem of discharge of hot air in the upper space relative to the mounting position of the cooling fan cannot be overcome although a hot air discharging efficiency can be improved.

Furthermore, JP-A-2003-173147 cannot overcome the problems that the specifications such as the configuration, dimension and the like of the panel holder and the problem of the mounting efficiency cannot be overcome.

BRIEF SUMMARY OF THE INVENTION

The present invention was made in view of the foregoing problems and an object thereof is to provide a cooling unit mounting structure for a flat display, which can realize lower costs and a higher assembling efficiency even when the specifications such as the configuration, dimension and the like of the panel holders differ between or among the panel manufacturers and which has a high cooling performance in a wide area including the upper location, and a plasma television set employing the above-described cooling fan mounting structure.

To overcome the foregoing and other problems, the present invention provides a cooling fan mounting structure for a flat display which displays a predetermined image on a screen based on a video signal externally supplied thereto, the cooling fan mounting structure comprising: a chassis bracket attached to a rear of the display; a screw hole, a positioning hole and a rectangle hole each provided in the chassis bracket; and a single type of fan holder to which a cooling fan is attached; the fan holder having an end provided with an insertion hole that is located in alignment with the screw hole, and through which a screw is inserted to be fixed when the chassis bracket is attached; a positioning convex portion fitted into the positioning hole thereby positioning the chassis bracket; a locking claw bent into a crank shape so that the locking claw has a rung lowered by a thickness of the chassis bracket and extended; the locking claw is inserted into the rectangle hole thereby to be locked.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

Referring to the drawings in which like reference character (s) present corresponding parts throughout.

DETAILED DESCRIPTION OF THE INVENTION

One embodiment of the present invention will be described in the following.

EMBODIMENT 1

Figure 1:
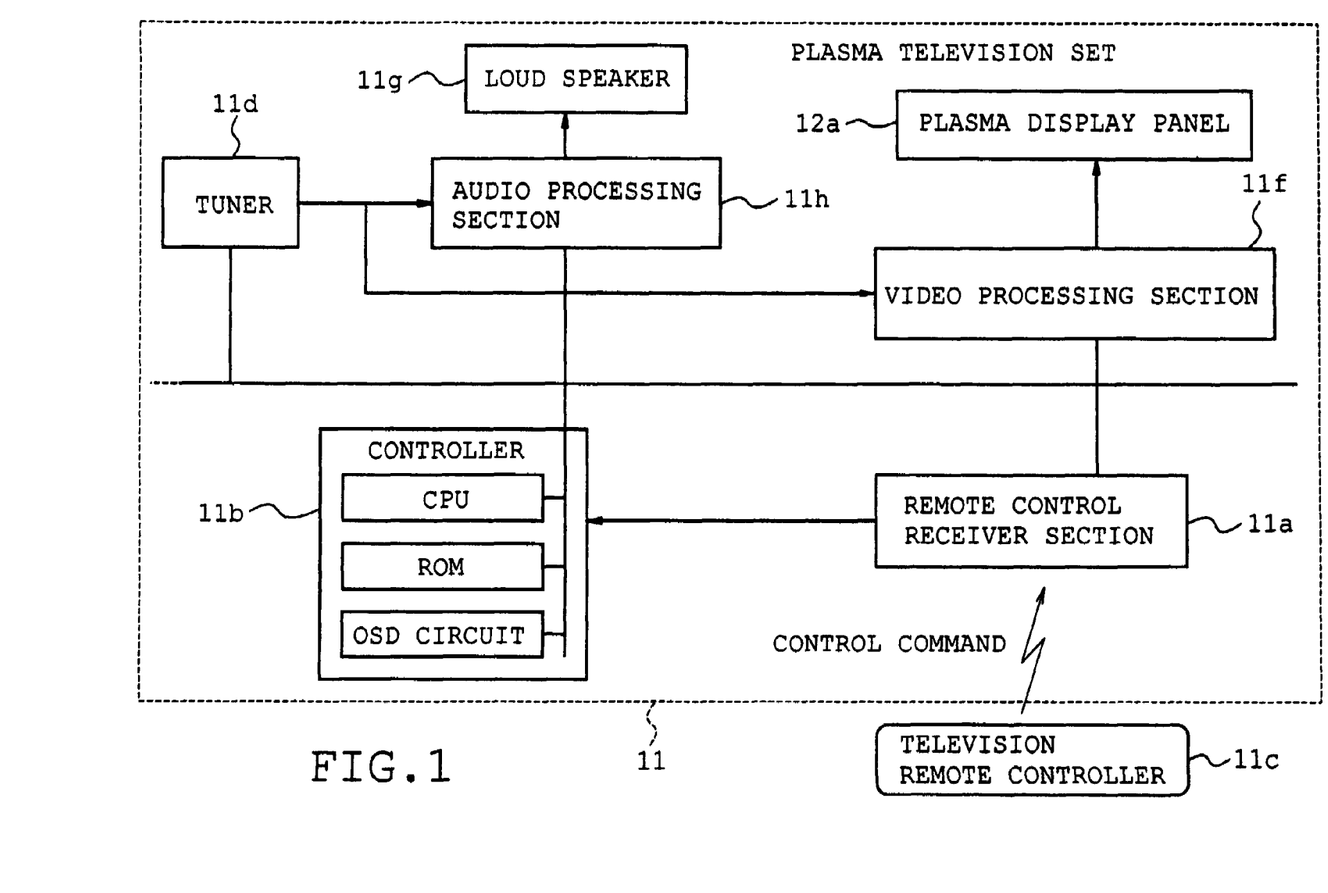
FIG. 1 is a block diagram explaining embodiment 1 of the present invention.

FIG. 1 is a block diagram showing a schematic electrical arrangement of the plasma television set employing a plasma display panel serving as a flat display in the embodiment.

In FIG. 1, the plasma television set 11 comprises a controller which controls the operation of plasma television body, a tuner 11d which extracts an television broadcast signal for a selected channel from television broadcast signals received by an antenna (not shown) and delivering the extracted signals, a video processing section 11f which displays on the plasma display panel 12a an image based on the television broadcast signal delivered by the tuner 11d or an externally supplied image signal, an audio processing section 11h producing from a loud speaker 11g sound based on the television broadcast signal delivered from the tuner 11d or an externally supplied audio signal, and a remote control receiving section 11a which receives a control command transmitted from a remote controller 11c.

The controller 11b controls on/off of power supply, channel change, up/down of sound volume and the like according to a control command received by the remote control receiving section 11i. Operating power is supplied from a power supply circuit (not shown) to various sections of the plasma television set 11. The power supply circuit is connected to a commercial power supply (AC 100 V, for example).

The plasma display panel 12a is a general-purpose plasma display panel assembly of a large size such as 37 inch or above which is supplied from a panel manufacturer. A filter and a cabinet are assembled to a front side of the plasma display panel 12a on the present line, whereby a plasma television set 11 is manufactured.

Figure 2:
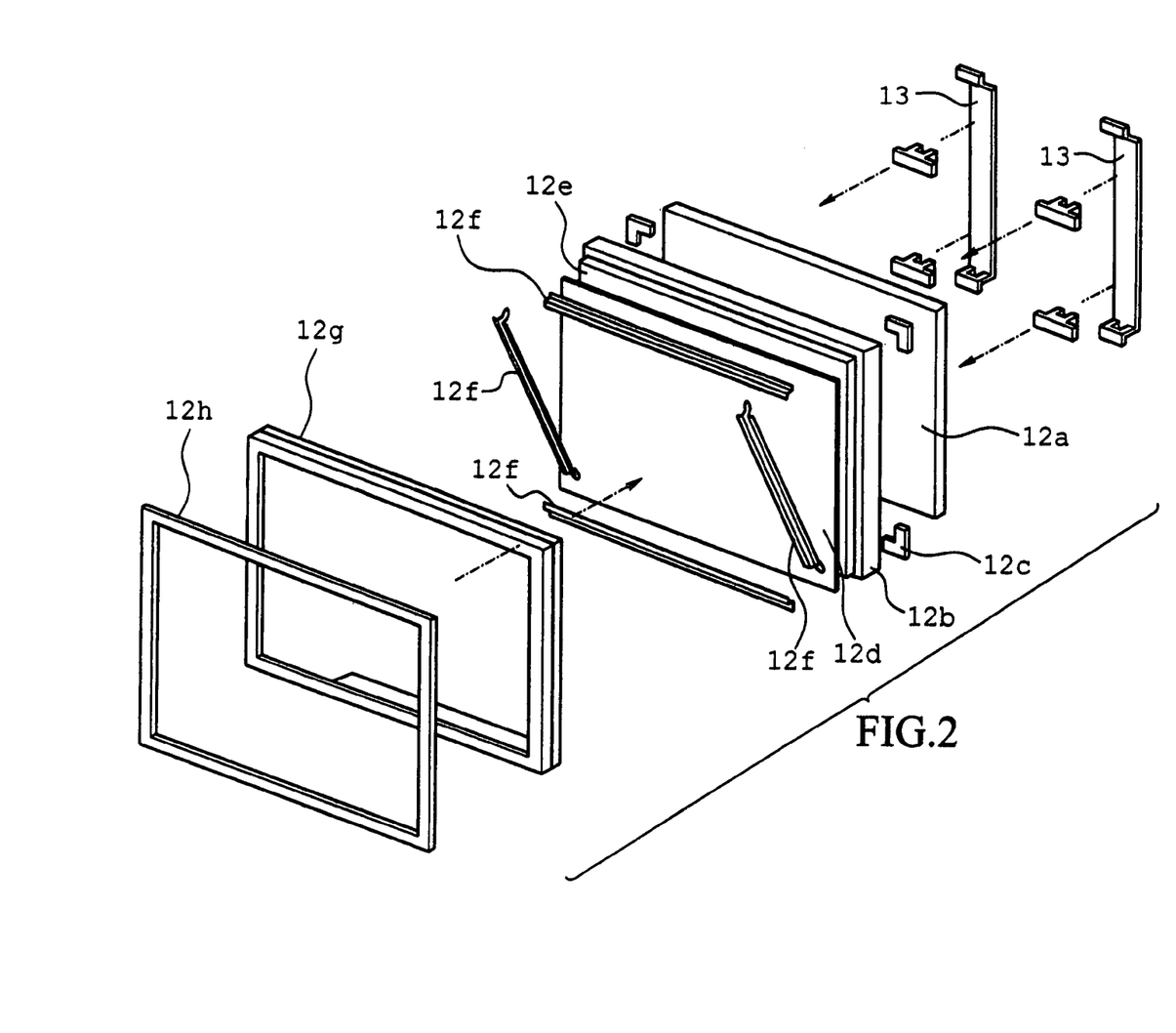
FIG. 2 is a perspective view explaining embodiment 1 of the invention.

FIG. 2 shows a structure of the plasma display panel to be assembled. In the figure, a plasma display panel 12a is attached to a rear of a standing generally frame-like panel holder 12b with spacers 12c being mounted on four corners of the panel holder rear. The plasma display panel 12a is fixed to the panel holder 12b by screws at one side of the latter. The spacers 12c are provided in order that the plasma display panel 12a is spaced from a filter 12d as will be described later.

On the other hand, the filter 12d is attached to a front of the panel holder 12b with a gasket 12e being interposed therebetween. Upper, lower, right and left sides of the filter 4 are engaged with four filter holders 12f each of which is a linear frame having a step with a crank-shaped section. The filter 12d is then fixed by screws at the front of the panel holder 12b. A generally frame-like cabinet 12g is attached to the panel holder 12b to which the plasma display panel 12a and the filter 12d are attached. A bezel 12h is then attached to the cabinet 12g so as to cover a gap between the cabinet 12g and a view-area outer periphery. The cabinet 12g and the bezel 12h are fixed by screws at rear of the panel holder 12b.

Two parallel chassis brackets 13 are mounted on the upper and lower frame portions of the panel holder 12b so as to be located at the rear side of the plasma display panel 12a. A control board, an input/output device and the like are mounted on the chassis brackets 9. Thus the chassis brackets 9 structurally serve as backbones.

In the assembling of the plasma television set 11, the panel holder 12b, plasma display panel 12a, filter 12d, cabinet 12g, chassis brackets 13 and the like are assembled together while these components are standing.

Since high voltage is applied to the plasma display panel 12a, a large amount of heat is generated from the plasma display panel 12a, the control board mounted on the rear of the plasma display panel 12a and the like during operation of the plasma display panel 12a. Moreover, a rear cabinet 14 is mounted around the plasma display panel 12a so as to be close to the same, whereupon a closed space is defined in which heat tends to remain.

Figure 3:
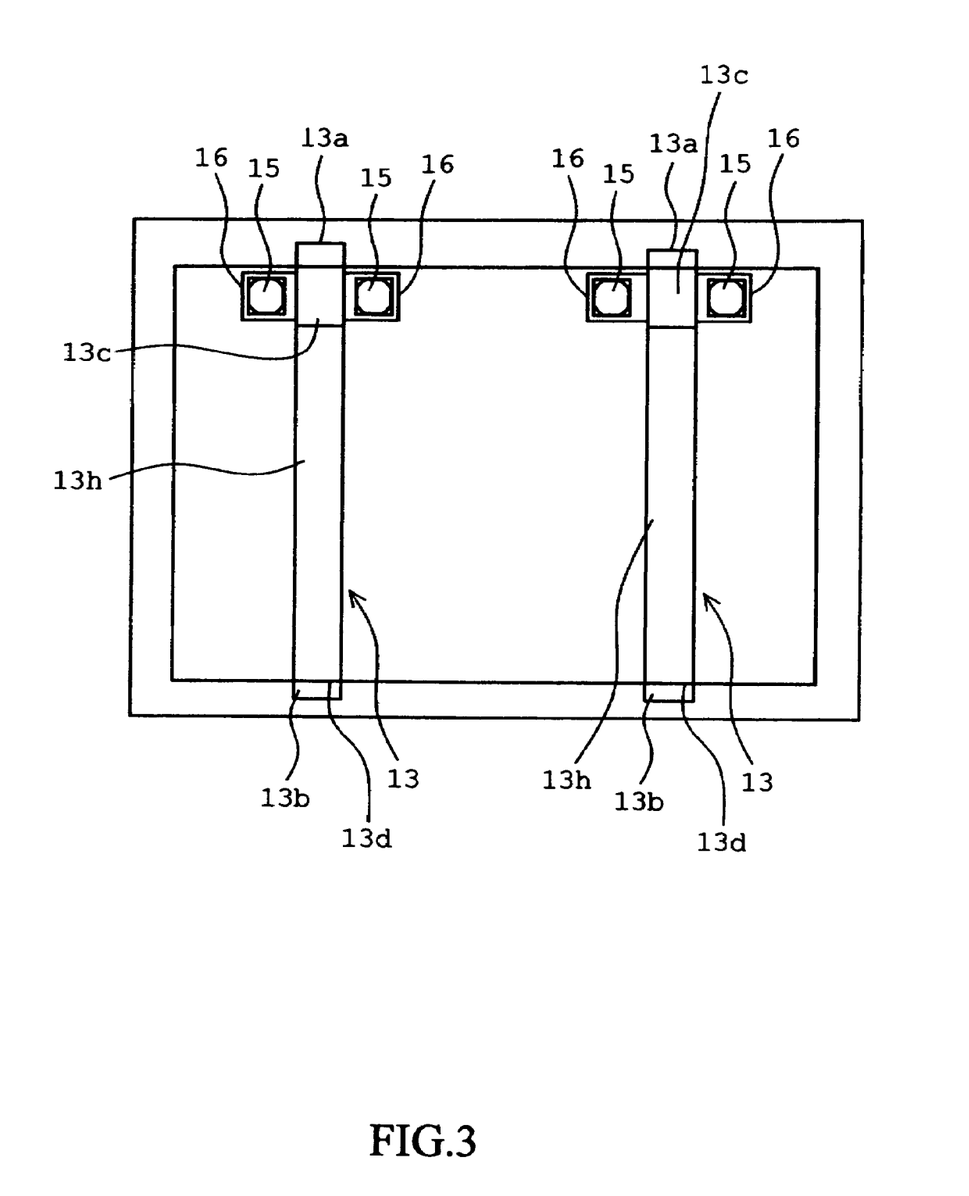
FIG. 3 is a front view explaining embodiment 1 of the invention.

As shown in FIGS. 3, cooling fans 15 are mounted on each chassis bracket 13 with a fan holders 16 being interposed therebetween. Each cooling fan 15 cools an interior atmosphere by sucking and discharging heated air in the interior space in order that an increase in the interior temperature due to the above-described heat generation may be restrained for stable operation.

Figure 4:
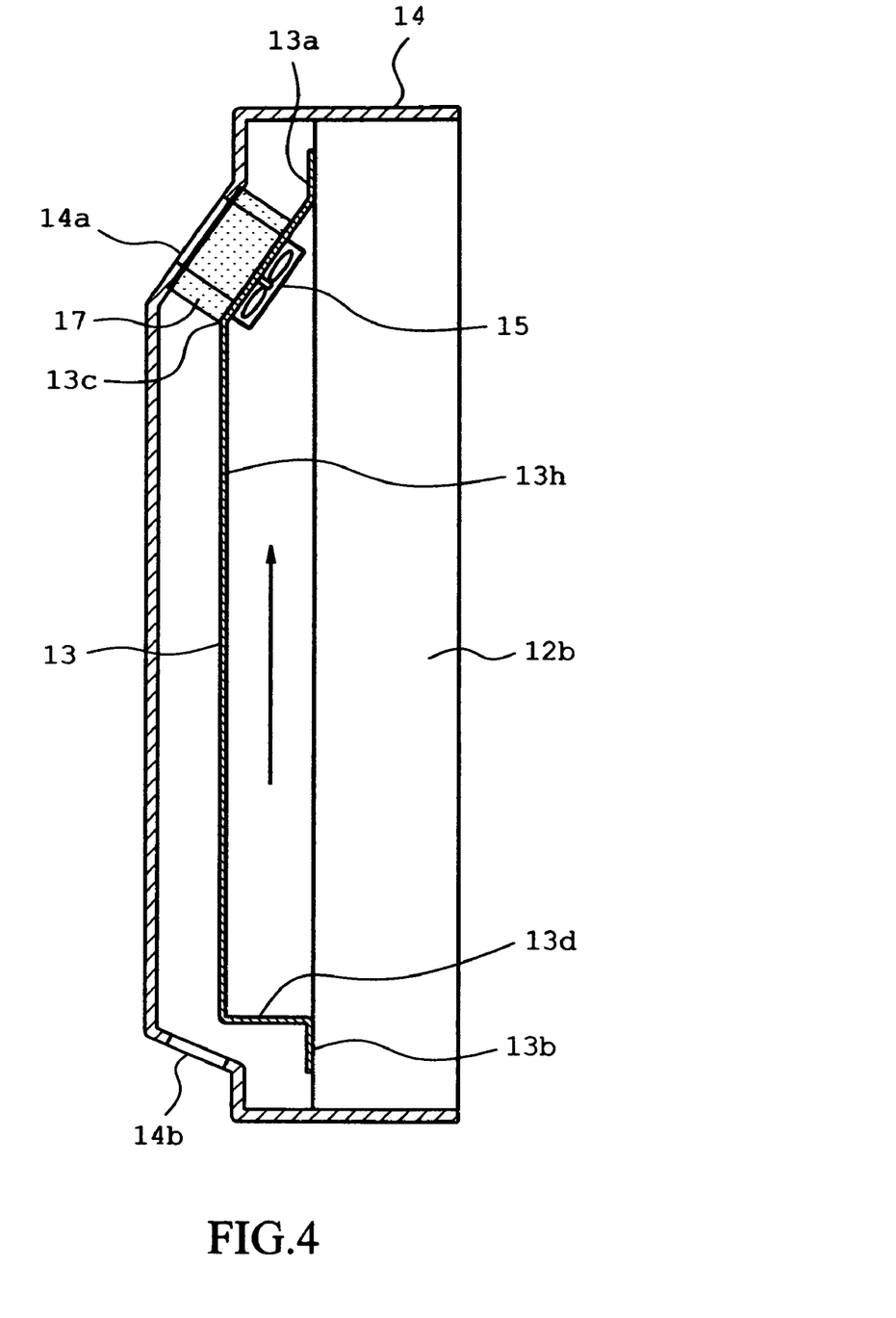
FIG. 4 is a longitudinal section explaining embodiment 1 of the invention.

More specifically, each chassis bracket 13 comprises upper and lower mounting horizontal portions 13a and 13b mounted on upper and lower frames of the panel holder 12b respectively, a slant protrusion 13c protruding from the upper mounting horizontal portion 13a, a perpendicular protrusion 13d perpendicularly protruding from the lower mounting horizontal portion 13b, and a horizontal top 13h bridging both protrusions 13c and 13d. Each chassis bracket 13 has a generally silk hat-shaped longitudinal section. The two chassis brackets 13 are disposed in parallel with each other so as to be symmetric about a central vertical axis of the panel holder 12b so as to extend between the upper and lower frame portions of the panel holder 12b and so as to be spaced from the rear of the plasma display panel 12a.

Figure 5A:
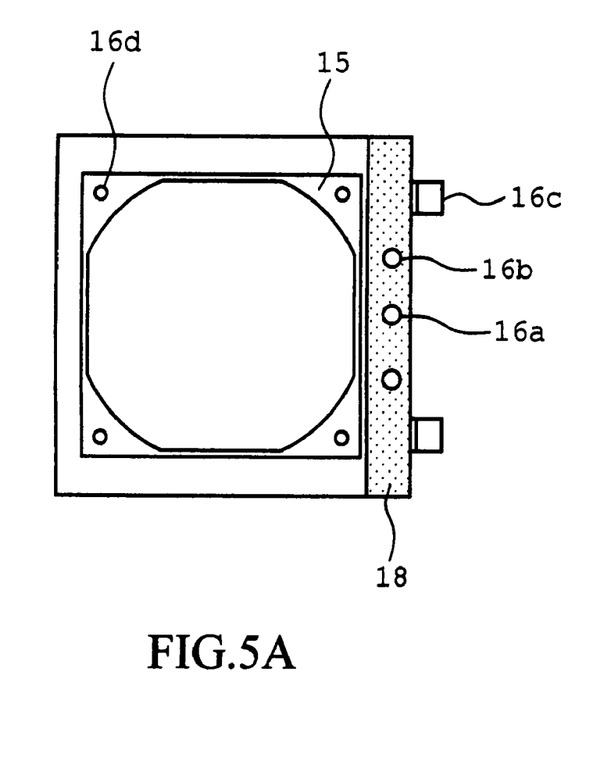
FIGS. 5A, 5B and 5C are partially enlarged views explaining embodiment 1 of the invention.
Figures 5B, 5C:
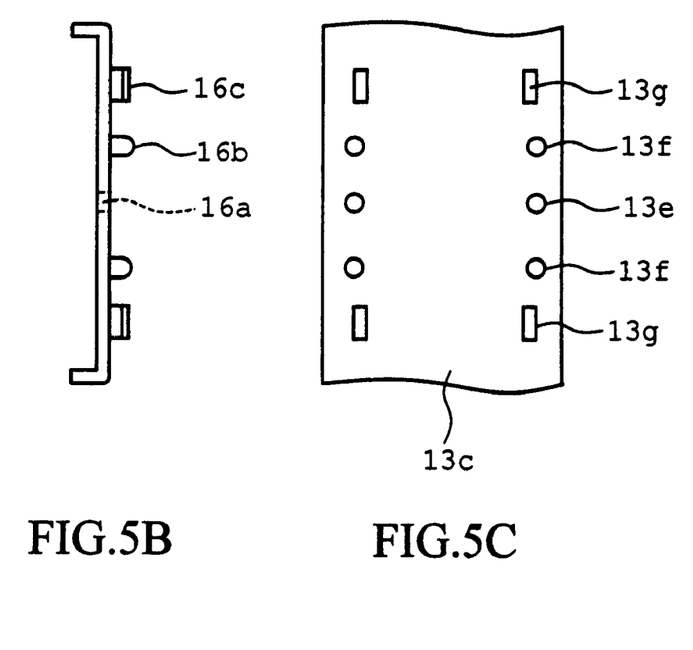

As shown in FIGS. 5A to 5C, each slant protrusion 13c includes two screw holes 13 formed in both widthwise ends respectively, a pair of positioning holes 13f spaced from each other at both lengthwise sides of the chassis bracket 13 with the screw hole 13e being interposed therebetween, and a pair of rectangle holes 13g spaced from each other at both lengthwise sides and offset in the widthwise direction with respect to each chassis bracket 13.

A single common type of fan holder 16 is provided irrespective of the type of plasma display panel 12a to be attached and has a generally rectangular annular shape so that the cooling fan 15 to be attached can suck in and discharge air. The fan holder 16 has an insertion hole 16a formed in a central portion of one of outer peripheral sides thereof and corresponding to a screw hole 13e formed in the slant protrusion 13c of the chassis bracket, and a pair of positioning convex portions 16b corresponding to the paired positioning holes 13f formed in the slant protrusion 13c of each chassis bracket 13. The fan holder 16 further has a pair of locking claws 16c each of which is formed in the slant protrusion 13c of the chassis bracket 13 and each of which is bent into such a crank shape that each locking claw has a rung outwardly lowering by a thickness of the chassis bracket from an outer peripheral end further spaced from both sides of the side interposing the insertion hole 16a and extends. The locking claws 16 correspond to the paired rectangle holes 13g formed in the slant protrusion 13c of the chassis bracket 13. The fan holder 16 further has mounting holes 16d formed in four outer peripheral corners thereof in order that the cooling fan 15 may be attached to the fan holder 16.

The cooling fans 15 are of a single small type common to all the fan holders 16 and each comprise a rotary fin (not shown) and a generally square annular frame supporting the rotary fin inside. Screw insertion holes are formed in four outer peripheral corners of the frame so as to correspond to the screw holes 16d of the fan holder 16 respectively. The cooling fan 15 is attached to the fan holder with screws (not shown) being inserted through the screw insertion holes. The rotary fin of the cooling fan 15 attached to the fan holder 16 is exposed in an annulus of the fan holder 16, whereby the cooling fan 15 is capable of supplying and discharging air through the annulus by the rotary fin.

The rear cabinet 14 has an upper portion thereof opposed to the cooling fan 15 in the assembled state of the plasma display panel. The upper portion of the rear cabinet 14 has a discharge slit 14*a*. The rear cabinet 14 further has a lower rear formed with a suction slit 14*b*. The rear cabinet 14 is constructed so that hot air in the closed space is efficiently discharged into an upper exterior.

The following describes the assembly of the components of the plasma television set 11 including the cooling fan 15.

Firstly, the cooling fan 15 is mounted on the fan holder 16 using the mounting screw holes 16*d* and the screws (not shown) so that the rotating fins are exposed in the annulus. Subsequently, the vibration-proof member 17 comprised of the nonwoven cloth, for example, is attached so as to be interposed between the cooling fan 15 and the rear cabinet 14 which is to be mounted on the outer peripheral surface of the fan holder 16. The vibration-proof member 17 is provided only on the outer peripheral surface of the fan holder 16 so as not to block the discharge air flow.

Subsequently, for example, four fan holders 16 are attached to both ends of the slant protrusion s 13*c* of the two chassis brackets 13 attached to the plasma display panel 12. The number and locations of the fan holders 16 may be changed within the total of four on both ends of the slant protrusions 13*c* of the two chassis brackets 13 depending on a situation.

The fan holders 16 will be attached to the slant protrusions 13*c* of the chassis brackets 13 in the following manner.

More specifically, while the vibration-proof member 18 comprised of the nonwoven cloth is attached to an abutment surface between the fan holder 16 and the slant protrusion 13*c*, the locking claws 16*c* are inserted into the respective rectangle holes 13*g* of the chassis bracket 13 from above and locked at the rung and simultaneously, the positioning convex portions 16*b* are fitted into the positioning holes 13*f* respectively thereby to be positioned, whereby the fan holder 16 is provisionally fixed under a condition where the insertion hole 16*a* substantially corresponds with the screw hole 13*e*.

Since two locking claws 16*c* are inserted into the respective rectangle holes 13*g* and locked therein in the above-described state, there is no possibility that the fan holder 16 may fall off the slant protrusion 13*c* of the chassis bracket 13. Accordingly, the fan holder 16 is provisionally fixed without support by hand. Furthermore, since the positioning convex portion 16*b* is fitted into the positioning hole 13*f*, the fan holder 16 can accurately be positioned relative to the slant protrusion 13*c*. Consequently, the insertion hole 16*a* and the screw hole 13*e* can easily be caused to correspond with each other without positioning adjustment by an operator.

Subsequently, screws are fastened through the insertion holes 16*a* into the screw holes 13*e* so that the cooling fan 15 is attached to the plasma display panel 12*a*. Thereafter, the rear cabinet 14 is attached to the plasma display panel 12*a* so that the discharge slits 14*a* are opposed to the cooling fan 14 and so that the vibration-proof member 17 mounted on the outer periphery of the fan holder 16 is abutted against the rear cabinet 14 thereby to be held.

The rear cabinet 14 has the suction slit 14*b* in the lower rear as well as the discharge slits 14*a* opposed to the cooling fan 15 as described above. Accordingly, upon operation of the cooling fan 15, hot air flow is produced which is directed from the suction slit 14*b* located lower than the discharge slit 14*a* toward the discharge slit 14*a* located higher than the suction slit 14*b*. As a result, the hot air in the closed space is efficiently moved to be discharged through the discharge slits 14*a* and cooled easily and reliably. Thus, hot air can be prevented from remaining in the upper part of the closed space without a large-sized cooling fan.

Furthermore, the cooling fans 15 are mounted on the slant protrusion located over the chassis bracket 13. The number of locations of the cooling fans 15 is suitably set among one to four. Accordingly, the cooling fans 15 can be provided without interference with the components such as the control board. Consequently, efficient air discharge can be achieved without block by the aforesaid components and an increase in the depth can also be restrained.

As explained above, plural small cooling fans 15 of the same type are attached via a single type common fan holder 16 to the slant protrusions 13*c* of the chassis brackets 13 so as to be provisionally fixed irrespective of the type of the plasma display panel 12*a*. Furthermore, the mounting locations and the number of the cooling fans 15 are suitably changeable. Accordingly, the cooling fan mounting structure of the embodiment can efficiently cool an atmosphere in a broader area including the upper part of the closed space covered by the rear cabinet 14 at lower costs with higher assembling efficiency at a lower noise level even when the specification of the plasma display panel 12*a* such as the shape, dimensions and the like differs between or among manufacturers.

According to the present invention, the locking claw provided on the fan holder is inserted into the rectangle hole of the chassis bracket, and the screws are inserted through the insertion holes of the fan holder into the screw holes of the chassis brackets corresponding with the insertion holes respectively while the positioning convex portion of the fan holder is fitted in the positioning hole thereby to be positioned. Accordingly, even when being to be mounted on plasma display panels of different manufacturers, the cooling fans can be mounted using a common single type of fan holder. Consequently, the costs can be reduced.

Furthermore, since the fan holder can provisionally be fixed when mounted on the chassis bracket, the screws can easily be tightened without accurately positioning the insertion hole relative to the screw hole although the plasma display panel stands. Consequently, the efficiency in the assembling work can be improved.

In another embodiment of the invention, the chassis bracket has both widthwise ends and two sets of the screw hole, the positioning hole and the rectangle hole are provided on the widthwise ends of the chassis bracket respectively. According to the invention, the location of the cooling fan is selected between both sides of the chassis bracket. Consequently, a suitable air discharging performance can be set according to the situation, and the air discharging efficiency can be improved at lower costs. Furthermore, since the air discharging performance of each cooling fan need not be increased uselessly, the size of the cooling fan can be reduced. Consequently, cost reduction, noise reduction, reduction in consumed electric power and weight reduction can be achieved.

Furthermore, the number of locations of the cooling fans 15 is suitably set among one to four. Accordingly, the cooling fans 15 can be provided without interference with the components such as the control board. Consequently, efficient air discharge can be achieved without block by the aforesaid components and an increase in the depth can also be restrained.

In further another embodiment of the invention, the chassis bracket includes upper and lower mounting horizontal portions mounted on upper and lower frames of the flat display respectively, a slant protrusion protruding aslant from the upper mounting horizontal portion, a perpendicular protrusion perpendicularly protruding from the lower mounting horizontal portion, and a horizontal top bridging both protrusions, whereupon the chassis bracket has a generally silk hat-shaped longitudinal section; the chassis bracket is mounted so as to bridge the upper and lower frame portions of the flat display and so as to be spaced from the rear of the flat display; and two pairs of the screw hole, the positioning hole and the rectangle hole are provided in both widthwise ends of the slant protrusion of the chassis bracket respectively. According to the invention, hot air in the closed space is absorbed and discharged from the lower part to the upper part by the cooling fan mounted on the slant protrusion of the chassis bracket. Consequently, a broader area including the upper part of the closed space covered by the rear cabinet can be cooled efficiently and reliably.

Furthermore, since the cooling fan is mounted on the slant protrusion located over the closed space, the cooling fan can be provided without interference with the components such as the control board. Consequently, efficient air discharge can be achieved without block by the aforesaid components and an increase in the depth can also be restrained.

In further another embodiment of the invention, a vibration-proof member comprised of nonwoven cloth or an expandable sealer is applied to an abutting surface so as to be interposed between the chassis bracket and the fan holder in attachment of the chassis bracket and the fan holder. According to the invention, vibration can be prevented by the vibration-proof members provided between the fan holder and the rear cabinet during operation of the cooling fan. Consequently, a noise reduction can be achieved.

In further another embodiment of the invention, the fan holder has an upper surface to which a vibration-proof member comprised of nonwoven cloth is applied so that the vibration-proof member is interposed between the rear cabinet and the fan holder upper surface. According to the invention, vibration can be prevented by the vibration-proof members provided between the fan holder and the rear cabinet during operation of the cooling fan. Consequently, a noise reduction can be achieved.

The present invention can also be realized by a plasma television set which further embodies the foregoing structure. As an example, a plasma television set that displays a predetermined image on a screen based on a video signal externally supplied thereto, the plasma television set comprising: a plasma display panel; a panel holder on which the plasma display panel is mounted; a chassis bracket attached to the panel holder; a fan holder mounted on the chassis bracket; a cooling fan mounted on the fan holder; a resin-molded rear cabinet covering a rear side of the plasma display panel; the panel holder has upper, lower, right and left sides and is formed into a frame shape, with the plasma display panel mounted inside the frame; the chassis bracket includes upper and lower mounting horizontal portions that are mounted on upper and lower frames of the panel holder respectively; a slant protrusion protruding aslant from the upper mounting horizontal portion; a perpendicular protrusion perpendicularly protruding from the lower mounting horizontal portion; and a horizontal top, bridging both protrusions, whereupon the chassis bracket has a generally silk hat-shaped longitudinal section; the chassis bracket is mounted so as to bridge the upper and lower frame portions of the panel holder, and to be spaced from the rear of the plasma display panel; and the slant protrusion has, in each of both widthwise ends, a screw hole, a pair of positioning holes spaced at both lengthwise ends of the chassis brackets interposing the screw hole therebetween, and a pair of rectangle holes also spaced at both lengthwise ends of the chassis brackets, interposing the screw hole therebetween and offset inward in a width direction with respect to the chassis bracket; the fan holder is formed substantially into a rectangular annular shape; the fan holder includes: a screw insertion hole that is formed to correspond to the screw hole formed in the slant protrusion of the chassis bracket; a pair of positioning convex portions that are formed to correspond to the paired positioning holes formed in the slant protrusion of the chassis bracket respectively; a pair of locking claws bent into a crank shape that each locking claw has a rung lowered by a thickness of the chassis bracket and extended, the locking claws corresponding to the paired rectangle holes formed in the slant protrusion of the chassis bracket respectively, and mounting screw holes formed in four outer peripheral corners of the fan holder respectively for a purpose of attachment of the cooling fan; the rear cabinet has an upper portion opposite the cooling fan and formed with a discharge slit and a lower rear formed with a suction slit; the cooling fan is mounted via the mounting screw holes on the fan holder so that rotating fins of the cooling fan are exposed in an annulus of the fan holder; a vibration-proof member comprised of nonwoven cloth is subsequently attached interposed between the fan holder and the rear cabinet on an outer peripheral surface of the fan holder; a vibration-proof member comprised of the nonwoven cloth is attached to an abutment surface between the fan holder and the slant protrusion of the chassis bracket; the locking claws are inserted into the respective rectangle holes of the chassis bracket from above and locked at the rung and simultaneously, the positioning convex portions are fitted into the positioning holes respectively, the fan holder is provisionally fixed under a condition where the insertion hole substantially corresponds with the screw hole; a screw is fastened through the insertion hole into the screw hole so that the cooling fan is attached to the plasma display panel and thereafter, the rear cabinet is attached so that the discharge slit corresponds to the cooling fan and so that the vibration-proof member provided on the outer peripheral surface of the fan holder abuts against the rear cabinet to be held; the plasma television set is assembled so that upon operation of the cooling fan, hot air flow is produced that is directed from the suction slit located lower than the discharge slit toward the discharge slit located higher than the suction slit.

According to the invention constructed as described above, the cooling fans are mounted on the chassis brackets using a single type of fan holder common to all the cooling fans. Furthermore, the locking claws are inserted into the respective rectangle holes of the chassis brackets from above and locked at the rung and simultaneously, the positioning convex portions are fitted into the positioning holes respectively thereby to be positioned, whereby the fan holder is provisionally fixed under a condition where the insertion hole substantially corresponds with the screw hole. Thereafter, the positioning convex portions are completely fixed by screws. Furthermore, hot air flow is produced by the cooling fans mounted on the slant protrusions of the chassis brackets. The hot air flow is directed from the suction slit located lower toward the discharge slit located higher. Furthermore, the number of locations of the cooling fans is suitably selected among one to four. Furthermore, vibration is suppressed during operation of the cooling fans by the vibration-proof members provided between the fan holder and rear cabinet and between the fan holder and each chassis bracket.

Accordingly, even when being to be mounted on plasma display panels of different manufacturers, the cooling fans can be mounted using a common single type of fan holder. Consequently, the costs can be reduced.

Furthermore, since the fan holder can provisionally be fixed when mounted on the chassis bracket, the screws can easily be tightened without accurately positioning the insertion hole relative to the screw hole although the plasma display panel stands. Consequently, the efficiency in the assembling work can be improved.

Furthermore, hot air flow is produced by the cooling fans mounted on the slant protrusions of the chassis brackets. The hot air flow is directed from the suction slit located lower toward the discharge slit located higher. Since hot air in the closed space is sucked to be discharged, air in the broader area including the upper part of the closed space covered with the rear cabinet can efficiently be cooled. Additionally, the number of the mounting locations is suitably selected among one to four according to the situation and one or more cooling fans are mounted. Consequently, the air discharging efficiency can further be improved. Furthermore, since the air discharging performance of each cooling fan need not be increased uselessly, the size of the cooling fan can be reduced. Consequently, cost reduction, noise reduction, reduction in consumed electric power and weight reduction can be achieved.

Furthermore, vibration is suppressed during operation of the cooling fans by the vibration-proof members provided between the fan holder and rear cabinet and between the fan holder and each chassis bracket, and further noise reduction can be achieved.

Furthermore, the cooling fan is mounted on the slant protrusion located over the chassis brackets, and the number of the mounting locations is suitably selected among one to four. Accordingly, the cooling fans are mounted without interference with the components such as the control board, and efficient air discharge can be achieved without block by these components and increase in the depth can be restrained.

The present invention should not be limited to the embodiments, and the embodiments may be modified as follows.

1. Each embodiment is described with the plasma display panel serving as the flat display. Each embodiment may be applied to various flat displays such as liquid crystal necessitating cooling, organic electroluminescence display (EL).

2. The mounting locations and number of the cooling fans in the embodiment are mere examples. One to four cooling fans can be selected from both ends of two chassis brackets according to the situation. Furthermore, the locations of the chassis bracket on which the fan holder is to be mounted should not be limited to the slant protrusions. For example, the chassis brackets may be mounted on a horizontal top.

3. The number of the chassis brackets should not be limited to two. One, three or more chassis brackets may be provided, and the fan holders may be mounted on each of the chassis brackets.

4. The screw holes, positioning holes and rectangle holes provided in each chassis bracket should not be limited to provision at respective both widthwise ends of the slant protrusion. The screw holes, positioning holes and rectangle holes may be provided in either one of the widthwise ends of the slant protrusion.

5. The locations and numbers of the screw holes, positioning holes and rectangle holes should not be limited to the locations and numbers in the foregoing embodiment. The locations and numbers of these holes may suitably be changeable if the locking claw of the fan holder is allowed to be inserted into the rectangle hole thereby to be lockable and to be positioned.

For example, the locking claw and the rectangle hole may or may not be disposed in symmetry. Also, the positioning convex portion and the positioning hole may or may not be disposed in symmetry. Either one of each pair may be provided.

6. The positioning holes and rectangle holes formed in the chassis bracket may be provided in the fan holder. The positioning convex portions and locking claws formed in the fan holder may be provided in the chassis bracket.

7. The shape of the locking claw should not be limited only if the locking claw is allowed to be inserted into the rectangle hole thereby to be locked. The rectangle hole may be changeable according to the shape of the locking claw.

8. A manner of positioning by the combination of the positioning hole and the positioning convex portion should not be limited to the manner in the foregoing embodiment. The positioning hole and the positioning convex portion may be changed only if the positioning hole and the positioning convex portion are fitted in each other thereby to achieve the positioning function. For example, the positioning hole may be a through hole.

9. The material of the vibration-proof members 17 and 18 should not be limited only if any vibration-proof function can be obtained. Nonwoven cloth, expandable sealer, silicon rubber, and the like may be used.

10. Of course, the structure described in the foregoing embodiment may be provided merely as a cooling fan mounting structure, instead of the plasma television set.

While the invention has been particularly shown and described with respect to preferred embodiments thereof, it should be understood by those skilled in the art that the foregoing and other changes in form and detail may be made therein without departing from the sprit and scope of the invention as defined in the appended claims.

Although the invention has been described in considerable detail in language specific to structural features and or method acts, it is to be understood that the invention defined in the appended claims is not necessarily limited to the specific features or acts described. Rather, the specific features and acts are disclosed as preferred forms of implementing the claimed invention. Therefore, while exemplary illustrative embodiments of the invention have been described, numerous variations and alternative embodiments will occur to those skilled in the art.

It should further be noted that throughout the entire disclosure, the labels such as left, right, front, back, top, bottom, forward, reverse, clockwise, counter clockwise, up, down, or other similar terms such as upper, lower, aft, fore, vertical, horizontal, proximal, distal, etc. have been used for convenience purposes only and are not intended to imply any particular fixed direction or orientation. Instead, they are used to reflect relative locations and/or directions/orientations between various portions of an object.

In addition, reference to "first," "second," "third," and etc. members throughout the disclosure (and in particular, claims) is not used to show a serial or numerical limitation but instead is used to distinguish or identify the various members of the group.

What is claimed is:

1. A cooling fan mounting structure for a flat display which displays a predetermined image on a screen based on a video signal externally supplied thereto, the cooling fan mounting structure comprising:

a chassis bracket attached to a rear of the display;

the chassis bracket includes upper and lower mounting horizontal portions mounted on upper and lower frames of the flat display respectively, with the chassis bracket mounted so as to bridge the upper and lower frame portions of the flat display and so as to be spaced from the rear of the flat display a screw hole, a positioning hole and a rectangle hole each provided in the chassis bracket; and a single type of fan holder to which a cooling fan is attached;

the fan holder having an end provided with an insertion hole that is located in alignment with the screw hole, and through which a screw is inserted to be fixed when the chassis bracket is attached;

a positioning convex portion fitted into the positioning hole thereby positioning the chassis bracket;

a locking claw bent into a crank shape so that the locking claw has a rung lowered by a thickness of the chassis bracket and extended;

the locking claw is inserted into the rectangle hole thereby to be locked.

2. The cooling fan mounting structure according to claim 1, wherein the chassis bracket has both widthwise ends and two sets of the screw hole, the positioning hole and the rectangle hole are provided on the widthwise ends of the chassis bracket respectively.

3. The cooling fan mounting structure according to claim 2, wherein: a slant protrusion protruding aslant from the upper mounting horizontal portion, a perpendicular protrusion perpendicularly protruding from the lower mounting horizontal portion, and a horizontal top bridging both protrusions, whereupon the chassis bracket has a generally silk hat-shaped longitudinal section;

and two pairs of the screw hole, the positioning hole and the rectangle hole are provided in both widthwise ends of the slant protrusion of the chassis bracket respectively.

4. The cooling fan mounting structure according to claim 1, wherein in attachment of the chassis bracket and the fan holder, a vibration-proof member comprised of nonwoven cloth or an expandable sealer is applied to an abutting surface so as to be interposed between the chassis bracket and the fan holder.

5. The cooling fan mounting structure according to claim 1, wherein the fan holder has an upper surface to which a vibration-proof member comprised of nonwoven cloth is applied so that the vibration-proof member is interposed between the rear cabinet and the fan holder upper surface.

6. A plasma television set that displays a predetermined image on a screen based on a video signal externally supplied thereto, the plasma television set comprising:

a plasma display panel;

a panel holder on which the plasma display panel is mounted;

a chassis bracket attached to the panel holder;

a fan holder mounted on the chassis bracket;

a cooling fan mounted on the fan holder;

a resin-molded rear cabinet covering a rear side of the plasma display panel;

the panel holder has upper, lower, right and left sides and is formed into a frame shape, with the plasma display panel mounted inside the frame;

the chassis bracket includes upper and lower mounting horizontal portions that are mounted on upper and lower frames of the panel holder respectively;

a slant protrusion protruding aslant from the upper mounting horizontal portion;

a perpendicular protrusion perpendicularly protruding from the lower mounting horizontal portion; and a horizontal top, bridging both protrusions, whereupon the chassis bracket has a generally silk hat-shaped longitudinal section;

the chassis bracket is mounted so to bridge the upper and lower frame portions of the panel holder, and to be spaced from the rear of the plasma display panel; and the slant protrusion has, in each of both widthwise ends, a screw hole, a pair of positioning holes spaced at both lengthwise ends of the chassis brackets interposing the screw hole therebetween, and a pair of rectangle holes also spaced at both lengthwise ends of the chassis brackets, interposing the screw hole therebetween and offset inward in a width direction with respect to the chassis bracket;

the fan holder is formed substantially into a rectangular annular shape;

the fan holder includes:

a screw insertion hole that is formed to correspond to the screw hole formed in the slant protrusion of the chassis bracket;

a pair of positioning convex portions that are formed to correspond to the paired positioning holes formed in the slant protrusion of the chassis bracket respectively;

a pair of locking claws bent into a crank shape that each locking claw has a rung lowered by a thickness of the chassis bracket and extended, the locking claws corresponding to the paired rectangle holes formed in the slant protrusion of the chassis bracket respectively, and mounting screw holes formed in four outer peripheral corners of the fan holder respectively for a purpose of attachment of the cooling fan;

the rear cabinet has an upper portion opposite the cooling fan and formed with a discharge slit and a lower rear formed with a suction slit;

the cooling fan is mounted via the mounting screw holes on the fan holder so that rotating fins of the cooling fan are exposed in an annulus of the fan holder;

a vibration-proof member comprised of nonwoven cloth is subsequently attached interposed between the fan holder and the rear cabinet on an outer peripheral surface of the fan holder;

a vibration-proof member comprised of the nonwoven cloth is attached to an abutment surface between the fan holder and the slant protrusion of the chassis bracket;

the locking claws are inserted into the respective rectangle holes of the chassis bracket from above and locked at the rung and simultaneously, the positioning convex portions are fitted into the positioning holes respectively, the fan holder is provisionally fixed under a condition where the insertion hole substantially corresponds with the screw hole;

a screw is fastened through the insertion hole into the screw hole so that the cooling fan is attached to the plasma display panel and thereafter, the rear cabinet is attached so that the discharge slit corresponds to the cooling fan and so that the vibration-proof member provided on the outer peripheral surface of the fan holder abuts against the rear cabinet to be held;

the plasma television set is assembled so that upon operation of the cooling fan, hot air flow is produced that is directed from the suction slit located lower than the discharge slit toward the discharge slit located higher than the suction slit.

* * * * *